United States Patent
Huang et al.

(10) Patent No.: US 7,728,232 B2
(45) Date of Patent: Jun. 1, 2010

(54) PRINTED CIRCUIT BOARD ASSEMBLY HAVING ADHESIVE LAYER

(75) Inventors: Feng-Yan Huang, Shenzhen (CN); Shing-Tza Liou, Taoyuan (TW)

(73) Assignees: FuKui Precision Component (Shenzhen) Co., Ltd., Shenzhen, Guangdong Province (CN); Foxconn Advanced Technology Inc., Tayuan, Taoyuan (TW)

( * ) Notice: Subject to any disclaimer, the term of this patent is extended or adjusted under 35 U.S.C. 154(b) by 62 days.

(21) Appl. No.: 11/964,578

(22) Filed: Dec. 26, 2007

(65) Prior Publication Data

US 2009/0035566 A1     Feb. 5, 2009

(30) Foreign Application Priority Data

Aug. 3, 2007     (CN)     ................. 2007 1 0075613

(51) Int. Cl.
*H05K 1/00*     (2006.01)
(52) U.S. Cl. .................. 174/254; 174/255; 174/257; 174/259; 361/749; 361/750; 428/354; 428/356
(58) Field of Classification Search ............. 428/40, 428/343–356; 174/255, 254, 257, 258; 361/749, 361/750
See application file for complete search history.

(56) References Cited

U.S. PATENT DOCUMENTS

| 4,209,481 | A | * | 6/1980 | Kashiro et al. | ............... 264/437 |
| 5,275,856 | A | * | 1/1994 | Calhoun et al. | ............. 428/41.1 |
| 5,751,068 | A | * | 5/1998 | McMahon et al. | ........... 257/774 |
| 6,093,476 | A | * | 7/2000 | Horiuchi et al. | ............ 428/209 |
| 6,854,985 | B1 | * | 2/2005 | Weiss | ........................... 439/91 |
| 6,908,318 | B2 | * | 6/2005 | Kawate | ...................... 439/91 |

* cited by examiner

*Primary Examiner*—Cathy Lam
(74) *Attorney, Agent, or Firm*—Jeffrey T. Knapp

(57) ABSTRACT

An exemplary adhesive layer includes an adhesive main body having a first adhesive surface and a second adhesive surface on an opposite side of the adhesive main body to the first adhesive surface. The adhesive main body defines a number of through-holes between the first adhesive surface and the second adhesive surface therein. The through-holes are filled with an inner adhesive that has a higher adhesion than the adhesive main body. Adhesiveness of the first adhesive surface and the second adhesive surface of the adhesive main body can be improved, thereby preventing a printed circuit board having the adhesive layer from distortion.

20 Claims, 9 Drawing Sheets

PRINTED CIRCUIT BOARD ASSEMBLY HAVING ADHESIVE LAYER

BACKGROUND

1. Technical Field

The present invention relates to printed circuit boards, particularly to an adhesive layer and a printed circuit board assembly having the adhesive layer.

2. Description of Related Art

In recent years, flexible printed circuit boards (FPCBs) are widely used in electronic devices for electrical connection due to their flexibility and lightness. Flexible printed circuit boards can be bent into various shapes adapted to being used for various electronic devices.

Generally, a double-sides adhesive tape can be used to fix a bended flexible printed circuit board. Referring to FIG. 7, a typical flexible printed circuit board 10 shaped in a folding manner is shown. The flexible printed circuit board 10 includes a first portion 11, a second portion 13 and a bending portion 12 interconnecting the first portion 11 and the second portion 12. The flexible printed circuit board 10 is bent into a U-shaped figuration with the second portion 13 overlapping the first portion 11 via bending of the bending portion 12. A double-sided adhesive tape 14 with two opposite adhesive surfaces (not labeled) is provided between the second portion 13 and the first portion 11. The two opposite adhesive surfaces of the double-sided adhesive tape 14 adhere to the first portion 11 and the second portion 13 respectively so that the second portion 13 is jointed with the first portion 11. Thus, the flexible printed circuit board 10 can maintain the folded structure.

However, an adhesion force between the double-sided adhesive tape 14 and the first board 11 and that between the double-sided adhesive tape 14 and the second board 13 are unsatisfactory, especially due to deterioration over time. Thus, a rebound force of the bending portion 12 can cause distortion of the flexible printed circuit board 10. For example, referring to FIGS. 8 and 9, the double-sided adhesive tape 14 is prone to being separated from the first portion 11 or the second portion 13. Thus, quality and performance of the electronic devices using such flexible printed circuit board 10 will be lowered.

What is needed, therefore, is an adhesive layer and a printed circuit board assembly having the adhesive layer, thereby preventing the printed circuit board assembly from distortion.

SUMMARY

One present embodiment provides an adhesive layer. The adhesive layer includes an adhesive main body. The adhesive main body has a first adhesive surface and a second adhesive surface on an opposite side of the adhesive main body to the first adhesive surface. The adhesive main body defines a number of through-holes between the first adhesive surface and the second adhesive surface. The through-holes are filled with an inner adhesive that has a higher adhesion than the adhesive main body.

Another present embodiment provides a printed circuit board having an adhesive layer. The printed circuit board includes a first portion, a second portion and an adhesive layer between the first portion and the second portion. The adhesive layer includes an adhesive main body having a first adhesive surface and a second adhesive surface on an opposite side of the adhesive main body to the first adhesive surface. The adhesive main body defines a number of through-holes between the first adhesive surface and the second adhesive surface. The through-holes are filled with an inner adhesive that has a higher adhesion than the adhesive main body.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below and with reference to the drawings.

Figure 1:
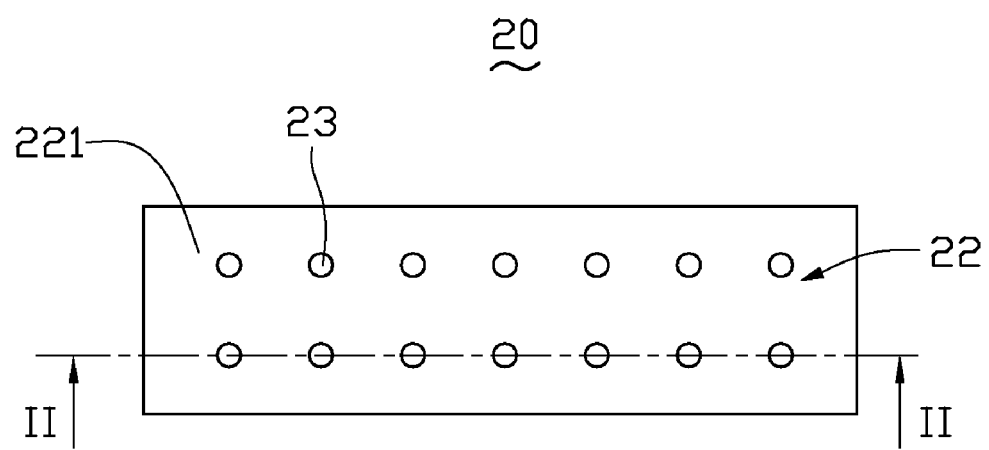
FIG. 1 is a schematic, top view of an adhesive layer according a first embodiment.
Figure 2:
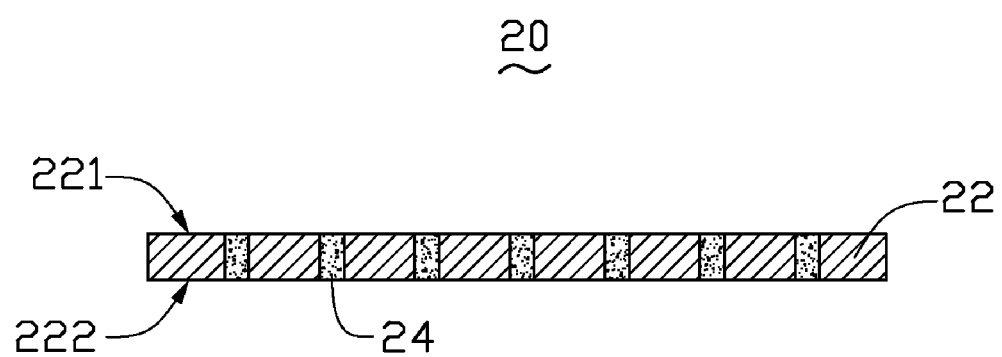
FIG. 2 is a schematic, cross-sectional view of the adhesive layer in FIG. 1 as viewed along line II-II.

Referring to FIGS. 1 and 2, an exemplary adhesive layer 20 according to a first embodiment is shown. The adhesive layer 20 includes an adhesive main body 22. The adhesive main body 22 can be a pressure sensitive adhesive (PSA). For example, the pressure sensitive adhesive can be comprised of poly iso butylene. The adhesive main body 22 has a first adhesive surface 221 and a second adhesive surface 222 on an opposite side of the adhesive main body 22 to the first adhesive surface 221. The adhesive main body 22 defines a number of through-holes 23 between the first adhesive surface 221 and the second adhesive surface 222 therein.

Cross-section shape of the through-hole 23 taken normal to the first adhesive surface 221 can be circle, square, rectangle, ellipse, cinquefoil or other desired figurations. The through-holes 23 can have an identical cross-section shape taken normal to the first adhesive surface 221. It is noted that the through-holes 23 can have different cross-section shapes taken normal to the first adhesive surface 221. Size, number and arrangement of the through-holes 23 can be determined according to an area of a printed circuit board to be adhered. In the present embodiment, the through-holes 23 each have an identical circular cross-section shape taken normal to the first adhesive surface 221. The through-holes 23 extend perpendicular to the first adhesive surface 221 and the second adhesive surface 222.

The through-holes 23 are filled with an inner adhesive 24. The inner adhesive 24 filled into the through-holes 23 is exposed from the first adhesive surface 221 and the second adhesive surface 222 simultaneously. The inner adhesive 24 has a higher adhesion than the adhesive main body 22. The inner adhesive 24 can be a fast drying adhesive such as an acrylics adhesive. The fast drying adhesive has an excellent adhesiveness and can be solidified quickly at room temperature, thereby improving adhesiveness of the first adhesive surface 221 and the second adhesive surface 222.

Additionally, the adhesive main body 22 can contain a number of electrically conductive particles, i.e., the adhesive main body 22 can be electrically conductive pressure sensitive adhesive. Meanwhile, the inner adhesive 24 can contain a number of electrically conductive particles also, i.e., the inner adhesive 24 can be an electrically conductive fast drying adhesive. The electrically conductive particles are configured for electrically connection.

It is understood that the adhesive main body 22 can defines only one through-hole 23. The only one through-hole 23 should have a large size so that the inner adhesive 24 filled into the through-hole 23 can have large adhesive areas exposed from the first adhesive surface 221 and the second adhesive surface 222 simultaneously. Such enough adhesive areas can reinforce the first adhesive surface 211 and the second adhesive surface 222 adhering to other elements (e.g., printed circuit boards) tightly. Thus, adhesiveness of the first adhesive surface 211 and the second adhesive surface 222 of the adhesive main body 22 can be improved effectively.

Figure 3:
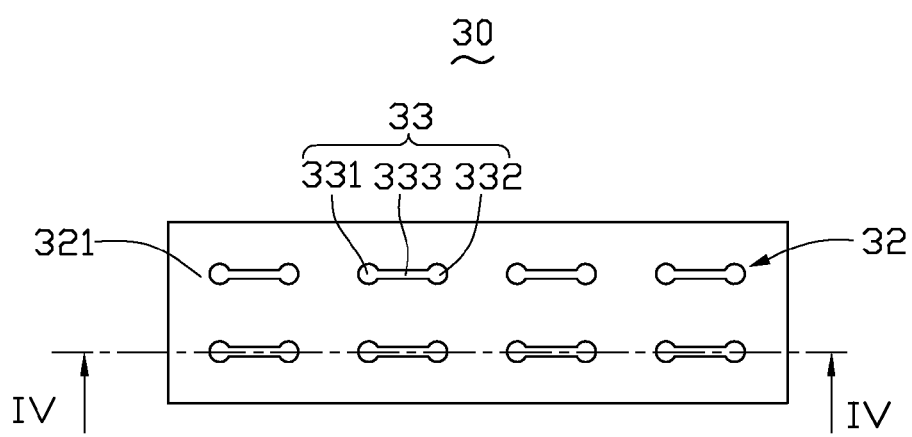
FIG. 3 is a schematic, top view of another adhesive layer according a second embodiment.
Figure 4:
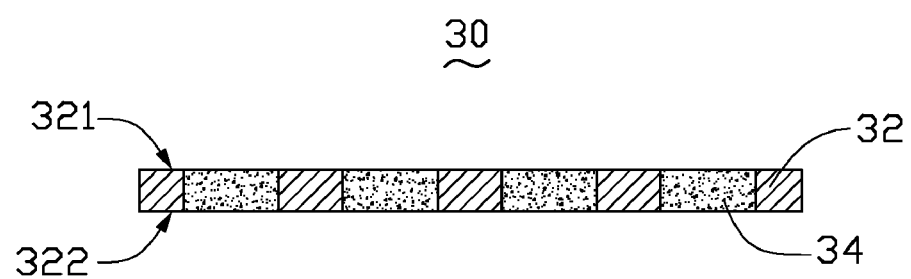
FIG. 4 is a schematic, cross-sectional view of the adhesive layer in FIG. 3 as viewed along line IV-IV.

Referring to FIGS. 3 and 4, an exemplary adhesive layer 30 according to a second embodiment is shown. The adhesive layer 30 of the second embodiment is similar to the adhesive layer 20 of the first embodiment and includes an adhesive body 32 and a number of through-holes 33 defined therein. Each of the through-holes 33 has a dumbbell shaped cross-section. The through-holes 33 extend perpendicular to the first adhesive surface 321 and the second adhesive surface 322.

In detail, Each of the through-hole 33 includes a first part 331, a second part 332, a communicating part 333 communicating with the first part 331 and the second part 332. Cross-section shape of the first part 331 and the second part 332 taken normal to the first adhesive surface 321 can be circle, square, rectangle, ellipse, cinquefoil or other desired figurations. The first part 331 and the second part 332 can have an identical cross-section shape taken normal to the first adhesive surface 321. It is noted that the first part 331 and the second part 332 can have different cross-section shapes taken normal to the first adhesive surface 321. In the present embodiment, the first part 331 and the second part 332 each has a circular cross-section shape taken normal to the first adhesive surface 321. The communicating part 333 has a rectangular-like cross-section shape taken normal to the first adhesive surface 321. Thus, an inner adhesive 34 filled into the through-hole 33 can have large adhesive areas exposed from the first adhesive surface 321 and the second adhesive surface 322 simultaneously, thereby improving adhesiveness of the first adhesive surface 321 and the second adhesive surface 322.

Figure 5:
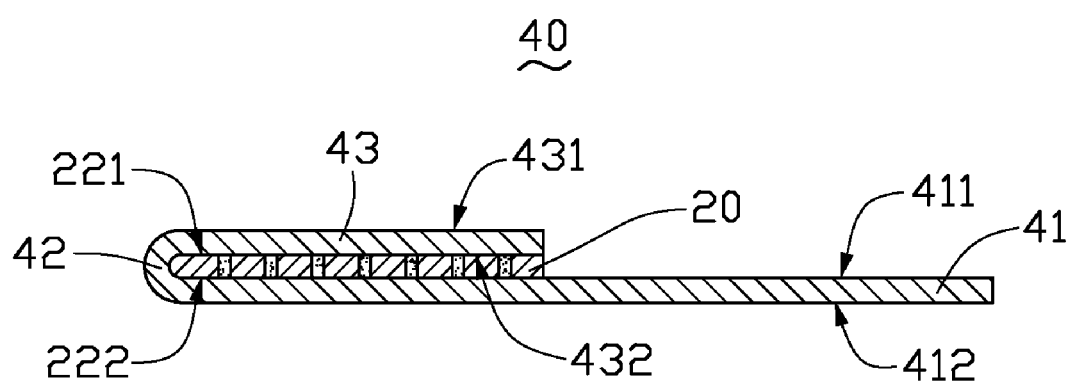
FIG. 5 is a schematic view of a printed circuit board according to a third embodiment.

Referring to FIG. 5, an exemplary printed circuit board assembly 40 according to a third embodiment is shown. The printed circuit board assembly 40 is a bended structure. The printed circuit board assembly 40 includes a first portion 41, a bending portion 42, a second portion 43 and the adhesive layer 20 between the first portion 41 and the second portion 43. The printed circuit board assembly 40 is bent into a U-shaped figuration with the second portion 43 overlapping the first portion 41 via bending of the bending portion 42. The first portion 41 and the second portion 43 can each be either a rigid portion such as a rigid printed circuit board or a flexible portion such as a portion of a flexible printed circuit board. In the present embodiment, the first portion 41, the bending portion 42 and the second portion 43 are all portions of a flexible printed circuit board.

The first portion 41 has a first surface 411 and a second surface 412 on opposite sides of the first portion 41. The second portion 43 has a third surface 431 and a fourth surface 432 on opposite sides of the second portion 43. The second portion 43 is overlapped on the first portion 41 via bending of the bending portion 42. The adhesive layer 20 is interposed between the second portion 43 and the first portion 41 so as to adhere the second portion 43 to the first portion 41 firmly. In detail, the first adhesive surface 221 of the adhesive layer 20 is attached to and adhered to the fourth surface 432 of the second portion 43. The second surface 222 of the adhesive layer 20 is attached to and adhered to the first surface 411 of the first portion 41. Thus, the second portion 43 and the first portion 41 are adhered together to form the printed circuit board assembly 40 having the bending structure.

It is understood that the printed circuit board assembly 40 also can use the adhesive layer 30 of the second embodiment.

It is also understood that the adhesive layer 20 and the adhesive layer 30 can be used in a general multilayer printed circuit board. For example, when the printed circuit board assembly 40 does not include the bending portion 42, the first portion 41 and the second portion 43 adhered onto the first portion 41 via the adhesive layer 20 or the adhesive layer 30 can collectively be a double-layer printed circuit board.

Figure 6:
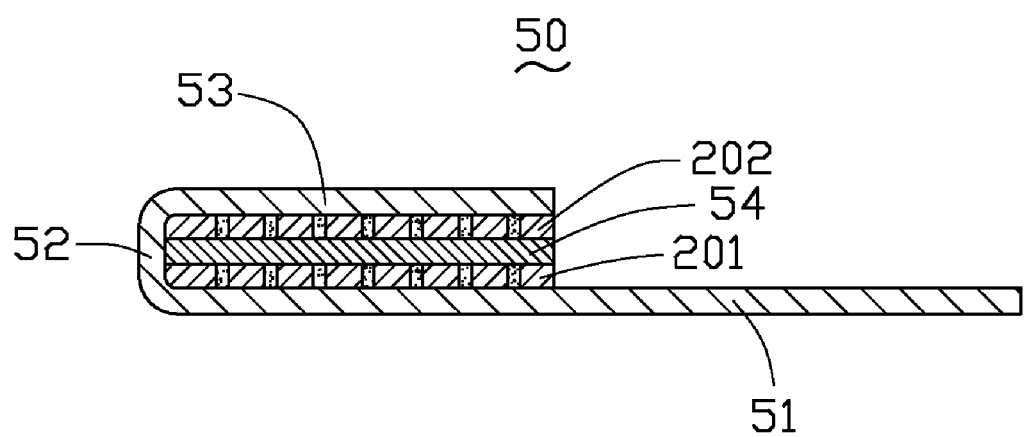
FIG. 6 is a schematic view of another printed circuit board according to a fourth embodiment.
Figure 7:
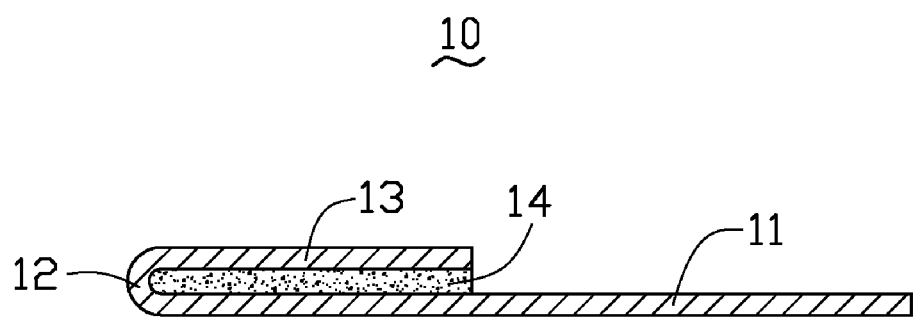
FIG. 7 is a schematic, cross-sectional view of a folded flexible printed circuit board with a first portion and a second portion jointed together via a double-sided adhesive layer.
Figure 8:
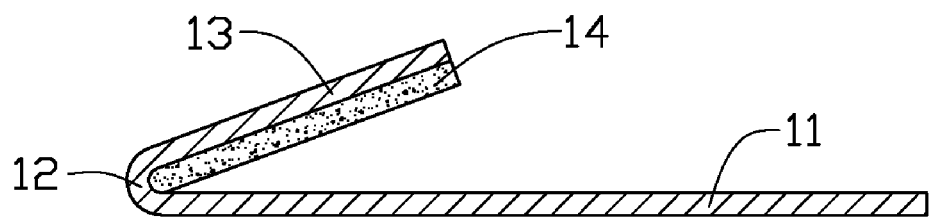
FIG. 8 is similar to FIG. 7, but shows the first portion of the folded flexible printed circuit board peeling-off from the double-sided adhesive layer.
Figure 9:
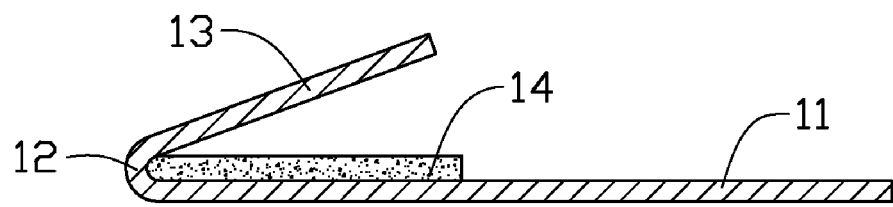
FIG. 9 is similar to FIG. 7, but shows the second portion of the folded flexible printed circuit board peeling-off from the double-sided adhesive layer.

Referring to FIG. 6, an exemplary printed circuit board assembly 50 according to a fourth embodiment is shown. The printed circuit board assembly 50 of the fourth embodiment is similar to the printed circuit board assembly 40 of the third embodiment, except that two adhesive layers are used to adhere a stiffener 54 to a first portion 51 and a second portion 53. In detail, a first adhesive layer 201 is interposed between the stiffener 54 and the first portion 51 so as to adhere the stiffener 54 to the first portion 51. A second adhesive layer 202 is interposed between the second portion 53 and the stiffener 54 so as to adhere the first portion 51 to the stiffener 54. Thus, the second portion 53, the stiffener 54 and the first portion 51 are adhered together to form the printed circuit board assembly 50 having a bending portion 52. In the present embodiment, the first portion 51, the bending portion 52 and the second portion 53 are all portions of a flexible printed circuit board.

The stiffener 54 is configured for strengthening structure of the printed circuit board 50. The stiffener 54 can be a copper clad laminate sheet, a metal sheet or a polyimide sheet. When the stiffener 54 is the metal sheet, according to demand of electrical connection between the first portion 51 and the second portion 53, the adhesive in the first adhesive layer 201 and the second adhesive layer 202 can contain a number of electrically conductive particles, and thus the first portion 51 and the second portion 53 can be respectively adhered to two sides of the stiffener 54 and electrically connect each other via the electrically conductive particles and the stiffener 54.

It is understood that the first adhesive layer 201 and the second adhesive layer 202 used in the printed circuit board assembly 50 can be one of the adhesive layer 20 of the first embodiment and the adhesive layer 30 of the second embodiment.

It is also understood that the printed circuit board assembly 50 can be described as a general multilayer printed circuit board. For example, when the printed circuit board assembly 50 does not include the bending portion 52, the first portion 51, the stiffener 54 and the second portion 53 adhered together via the first adhesive layer 201 and the second adhesive layer 202 can collectively be a strengthened double-layer printed circuit board.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended.

What is claimed is:

1. A printed circuit board assembly, comprising:
a first portion, a second portion and an adhesive layer interposed between the first portion and the second portion, the adhesive layer comprising an adhesive main body having a first adhesive surface and a second adhesive surface on an opposite side of the adhesive main body to the first adhesive surface, the adhesive main body defining a plurality of through-holes between the first adhesive surface and the second adhesive surface, the through-holes being filled with an inner adhesive that has a higher adhesion than the adhesive main body, the inner adhesive being a fast drying, acrylic adhesive.

2. The printed circuit board assembly as claimed in claim 1, wherein the fast drying, acrylic adhesive comprises a plurality of electrically conductive particles.

3. The printed circuit board assembly as claimed in claim 1, wherein the adhesive main body is comprised of a pressure sensitive adhesive.

4. The printed circuit board assembly as claimed in claim 3, wherein the adhesive main body comprises a plurality of electrically conductive particles.

5. The printed circuit board assembly as claimed in claim 1, wherein each of the through-holes has a configuration of a dumbbell shaped cross-section taken normal to the first adhesive surface.

6. The printed circuit board assembly as claimed in claim 1, further comprising a bending portion interconnecting the first portion and the second portion, the bending portion, the first portion, and the second portion being respective portions of a flexible printed circuit board.

7. The printed circuit board assembly as claimed in claim 1, further comprising a stiffener interposed between the first portion and the second portion, wherein the stiffener is adhered to the first portion and the second portion via respective portions of the adhesive layer.

8. The printed circuit board assembly as claimed in claim 1, wherein the through-holes are exposed at the first and second adhesive surfaces, one end of the inner adhesive is exposed at the first adhesive surface and is in contact with the second portion, and another end of the inner adhesive is exposed at the second adhesive surface and is in contact with the first portion.

9. The printed circuit board assembly as claimed in claim 1, further comprising a stiffener and another adhesive layer, wherein said adhesive layer is interposed between and in contact with the first portion and the stiffener, said another adhesive layer is interposed between and in contact with the second portion and the stiffener, and the stiffener is interposed between and in contact with the two adhesive layers.

10. A printed circuit board assembly, comprising:
a first portion, a second portion and an adhesive layer interposed between the first portion and the second portion, the adhesive layer comprising an adhesive main body having a first adhesive surface and a second adhesive surface on an opposite side of the adhesive main body to the first adhesive surface, the adhesive main body defining a plurality of through-holes between the first adhesive surface and the second adhesive surface, the through-holes being filled with an inner adhesive that has a higher adhesion than the adhesive main body, the adhesive main body comprising a pressure sensitive adhesive comprising a plurality of electrically conductive particles.

11. The printed circuit board assembly as claimed in claim 10, further comprising a bending portion interconnecting the first portion and the second portion, the bending portion, the first portion, and the second portion being respective portions of a flexible printed circuit board.

12. The printed circuit board assembly as claimed in claim 10, further comprising a stiffener interposed between the first portion and the second portion, wherein the stiffener is adhered to the first portion and the second portion via respective portions of the adhesive layer.

13. A printed circuit board assembly, comprising:
a first portion, a second portion and an adhesive layer interposed between the first portion and the second portion, the adhesive layer comprising an adhesive main body having a first adhesive surface and a second adhesive surface on an opposite side of the adhesive main body to the first adhesive surface, the adhesive main body defining a plurality of through-holes between the first adhesive surface and the second adhesive surface, the through-holes being filled with an inner adhesive that has a higher adhesion than the adhesive main body; and
a stiffener and another adhesive layer, wherein said adhesive layer is interposed between the first portion and the stiffener, said another adhesive layer is interposed between the second portion and the stiffener, and the stiffener is interposed between the two adhesive layers.

14. The printed circuit board assembly as claimed in claim 13, wherein said adhesive layer is in contact with the first portion and the stiffener, said another adhesive layer is in contact with the second portion and the stiffener, and the stiffener is in contact with the two adhesive layers.

15. The printed circuit board assembly as claimed in claim 13, wherein the through-holes are exposed at the first and second adhesive surfaces, one end of the inner adhesive is exposed at the first adhesive surface and is in contact with the first portion, and another end of the inner adhesive is exposed at the second adhesive surface and is in contact with the stiffener.

16. The printed circuit board assembly as claimed in claim 13, further comprising a bending portion interconnecting the first portion and the second portion, the bending portion being in contact with a side surface of the stiffener and side surfaces of the two adhesive layers, each of the bending portion, the first portion, and the second portion being a portion of a flexible printed circuit board.

17. The printed circuit board assembly as claimed in claim 13, wherein the stiffener is one of a copper clad laminate sheet, a metal sheet, and a polyimide sheet.

18. The printed circuit board assembly as claimed in claim 13, wherein said another adhesive layer comprises another adhesive main body defining a second plurality of through-holes therein, and said second plurality of through-holes are filled with another inner adhesive that has a higher adhesion than said another adhesive main body.

19. The printed circuit board assembly as claimed in claim 18, wherein each adhesive main body is an electrically conductive pressure sensitive adhesive.

20. The printed circuit board assembly as claimed in claim 18, wherein each inner adhesive is an acrylic adhesive.

* * * * *